(12) United States Patent
Stellarum et al.

(10) Patent No.: US 11,874,304 B2
(45) Date of Patent: Jan. 16, 2024

(54) METER-TO-TRANSFORMER CONNECTIVITY CORRECTION

(71) Applicant: Itron, Inc., Liberty Lake, WA (US)

(72) Inventors: Brendan Stellarum, Honolulu, HI (US); Erik Nilssen, Escondido, CA (US)

(73) Assignee: ITRON, INC., Liberty Lake, WA (US)

( * ) Notice: Subject to any disclaimer, the term of this patent is extended or adjusted under 35 U.S.C. 154(b) by 357 days.

(21) Appl. No.: 17/150,169

(22) Filed: Jan. 15, 2021

(65) Prior Publication Data
US 2022/0229095 A1      Jul. 21, 2022

(51) Int. Cl.
| | | |
|---|---|---|
| G01R 19/00 | (2006.01) | |
| G01R 19/25 | (2006.01) | |
| G06Q 50/06 | (2012.01) | |

(52) U.S. Cl.
CPC ....... *G01R 19/003* (2013.01); *G01R 19/2513* (2013.01); *G06Q 50/06* (2013.01)

(58) Field of Classification Search
CPC ... G01R 19/003; G01R 19/2513; G06Q 50/06
USPC ........................................................ 700/291
See application file for complete search history.

(56) References Cited

U.S. PATENT DOCUMENTS

| | | | |
|---|---|---|---|
| 10,571,493 B2 | 2/2020 | Sonderegger | |
| 2012/0221265 A1* | 8/2012 | Arya | G01R 29/18 |
| | | | 702/61 |

OTHER PUBLICATIONS

Arya, et al.; Voltage-based clustering to identify connectibity relations ships in distribution networks; Conference paper dated Oct. 2013; 7 pages.
Short, T., "Advanced metering for phase identification, transformer identification, and secondary modeling," IEEE Transactions on Smart Grid, vol. 4, Issue 2, Jun. 2013, pp. 651-658.

* cited by examiner

*Primary Examiner* — Mohammad Ali
*Assistant Examiner* — Saad M Kabir
(74) *Attorney, Agent, or Firm* — Lee & Hayes P.C.

(57) ABSTRACT

The disclosure describes techniques for providing meter-to-transformer connectivity information and/or correction, using voltage-correlation, distance, and/or address data. In an example, a meter generates a time-series of voltage-changes. Transformers geographically close enough to the meter are assigned a time-series of voltage-changes. Pearson's Correlation Coefficient (PCC) values of the meter with respect to individual transformers are determined. A reference PCC value of the meter is set to be an average of a largest and a second largest PCC value from among the PCC values of the meter. Voltage-correlation confidence rating (VCCR) values for the meter with respect to each transformer that is within the threshold distance from the meter are calculated using the PCC. Based at least in part on the VCCR values for the meter with respect to each transformer that is within the threshold distance from that meter, a probability of the meter being connected to each transformer is determined.

20 Claims, 6 Drawing Sheets

METER-TO-TRANSFORMER CONNECTIVITY CORRECTION

BACKGROUND

Electrical utility companies need accurate records that describe meter-to-transformer connectivity. Such records assist in balancing loads on electrical feeders associated with each phase of power and preventing individual transformers from being overloaded. Additionally, accurate records promote the safe operation of an electrical power grid and assist in the rapid management of power outages.

However, many utility companies have poor records describing meter-to-transformer connectivity. In an example, workers may change the connection of a meter from a first transformer to a second transformer to balance the load between phases of power or to prevent overloading of the first transformer. If the workers do not update the records, an error will be present. Over time, such errors accumulate, and may be present in approximately 10% to 35% of records of all meter-to-transformer connections.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. Moreover, the figures are intended to illustrate general concepts, and not to indicate required and/or necessary elements.

DETAILED DESCRIPTION

Overview

Figure 1:
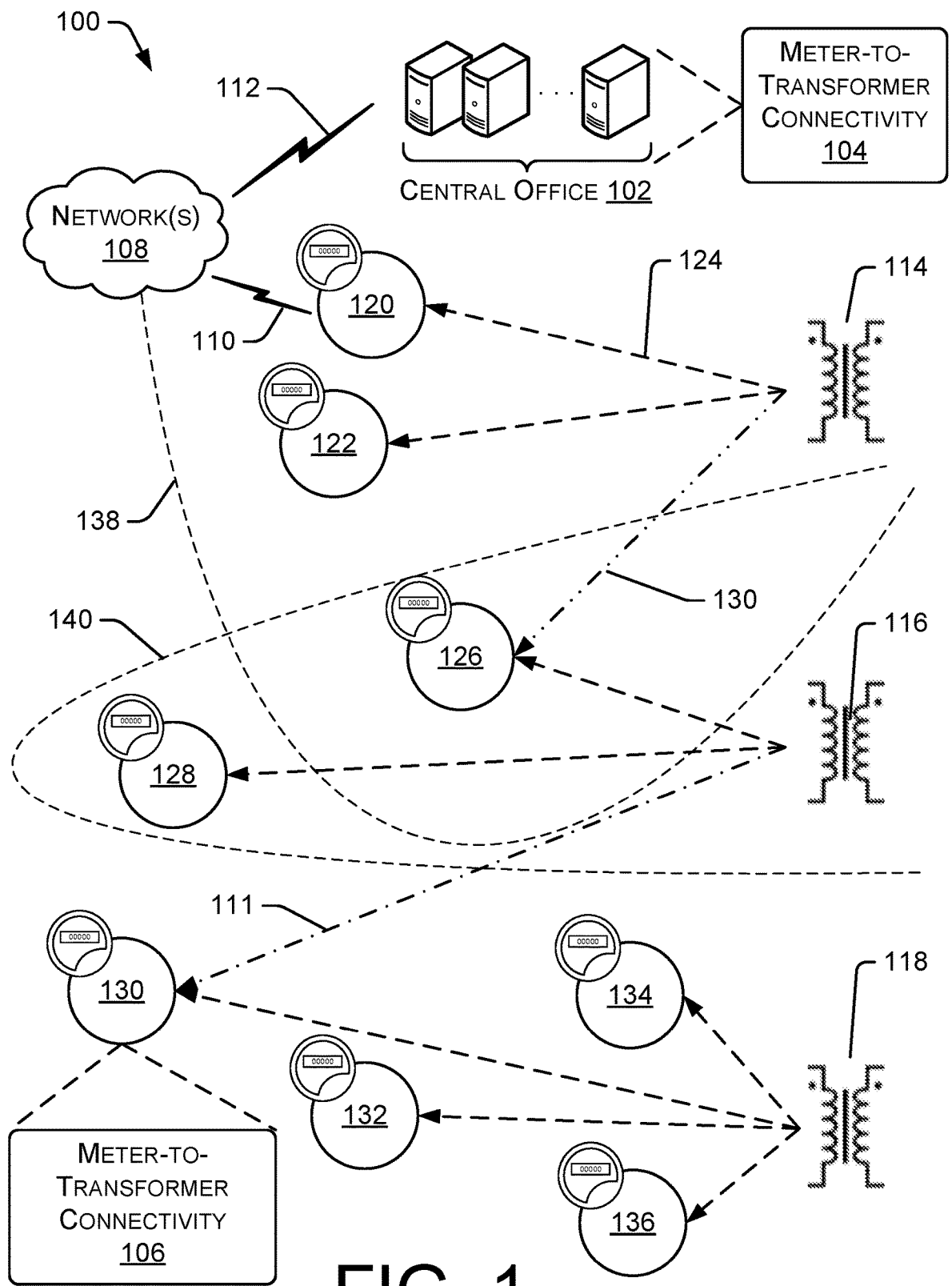
FIG. 1 is a block diagram showing an example electrical grid, and showing example meter-to-transformer connectivity techniques operable on one or more platforms in either distributed or localized configurations.

The disclosure describes techniques for providing meter-to-transformer connectivity information and/or correction, using voltage correlation, distance, and/or address data. In an example, the techniques may be implemented at least in part using a neural network. For each meter, a time-series of voltage-changes is generated (e.g., by making voltage measurements and recording voltage-change data sampled over time). For transformers without a voltage meter, a time-series of voltage-changes is assigned. In an example assignment, a statistical measure of a central tendency is evaluated for data including the time-series of voltage-changes of all meters indicated to be connected to the transformer by a record. The statistical measure is used to select a time-series having "median," "average" and/or "central" voltage-changes for assignment to the transformer. (Note: this record could be the record in need of updating and correction.) A Pearson's Correlation Coefficient (PCC) is determined between the meter and each transformer within a threshold distance of the meter, based at least in part on the time-series of voltage-changes of the meter correlated to the estimated (assigned) time-series of voltage-change for the transformer. For the meter, a reference PCC is set or assigned to be an average of the two highest PCC values of the meter with transformers less than the threshold distance away. A voltage-correlation confidence rating (VCCR) value is set for the meter with each transformer within the threshold distance of the meter, based at least in part on the set PCC value for the meter, and based at least in part on the PCC value between the meter and each transformer within the threshold distance. All VCCR values (associated with transformers less than the threshold distance from the meter) are sent to an algorithm (e.g., softmax). In the example of softmax, "overall confidence values" for all possible transformers to which the meter is connected are adjusted so that their sum is 100%. The meter is then assigned to the transformer with which the meter has the greatest "overall confidence value." Accordingly, the record of meter-to-transformer connections is updated to reflect that the meter is connected to the transformer with which it has the greatest overall confidence value. Several iterations of the method may result in a more stable meter-to-transformer assignment. In an example, the updated record is then utilized to determine if load balancing is indicated (e.g., moving meters from one phase of power to another phase of power), and if so, the load balancing may be performed by service crews. In a second example, the updated record may be utilized to determine if transformer overload is indicated, and if so, the load may be reduced by service crews who more evenly distribute meters among transformers. Load balancing among power phases and appropriate transformer-loading improves the safety and efficiency of the electrical grid.

Example System and Techniques

FIG. 1 shows an example electrical grid 100, and showing example techniques to obtain meter-to-transformer connectivity information and/or to correct over-loaded phases and/or transformers. In examples, the techniques may utilize voltage correlation, distance, and/or address data to determine aspects of electrical grid connectivity. In example implementations, the techniques may be operable using a neural network configured on one or more platforms using either distributed or localized strategies and computing devices.

In the example shown, a central office server 102 includes processors and memory, and can be operated by a utility company or third-party cloud service. In one example configuration, the meter-to-transformer connectivity software 104 may include one or more software application(s), and may be located on the utility company server 102. In another example, some or all of the functionality and software 106 enabling meter-to-transformer connectivity techniques may be located on a metering device 130 or other networked computing device. In a further example, the meter-to-transformer connectivity techniques may be distributed over two or more locations, and the software, application(s) and techniques 104, 106 may be configured to operate together synergistically to provide meter-to-transformer connectivity information and/or correction.

Networks 108 may include the internet and/or one or more private networks, which may include utility company routers, mesh network of metering device, star networks, and/or other devices. In the example shown, messages, commands and data flow upstream and downstream within utility company radio communications 110 and internet connections 112.

A plurality of transformers 114, 116, 118 provide electricity to respective pluralities of electricity meters. In the example shown, transformer 114 provides electricity to meters 120, 122 by means of wiring 124. Similarly, transformer 116 provides electricity to meters 126, 128. Connection 130 symbolizes a recordkeeping error, in which transformer 114 is listed in records (e.g., network topology descriptions) as providing electricity to meter 126, while in fact transformer 116 provides electricity to meter 126. Transformer 118 provides electricity to meters 130, 132, 134, 136.

While not shown to scale and with some distortion, a region having boundary 138 shows the threshold distance beyond which the transformer 114 cannot supply electricity to meters. That is, meters 120, 122, 126 are within the boundary 138 and can reasonably be assumed to possibly be served by transformer 114. However, meters 128-136 are outside threshold boundary 138 and cannot reasonably be assumed to possibly be served by transformer 114. Similarly, boundary 140 is the threshold distance from transformer 116, showing that meters 126 and 128 can reasonably be served by transformer 116, while other meters cannot.

Thus, FIG. 1 shows that while meter 126 is listed in records (symbolized by connection 130) as connected to transformer 114, it is actually served by transformer 116. In an example, a worker may have moved wiring to disconnect meter 126 from transformer 114, and to attach meter 126 to transformer 116, but failed to enter that action into appropriate records. And further, since meter 126 is within both boundaries 138, 140 connection to either transformer 114, 116 is possible.

Example Methods

In some examples of the techniques discusses herein, the methods of operation may be performed by one or more application specific integrated circuits (ASIC) or may be performed by a general-purpose processor utilizing software defined in computer readable media. In the examples and techniques discussed herein, the memory (e.g., in central office server(s) 102 may comprise computer-readable media and may take the form of volatile memory, such as random-access memory (RAM) and/or non-volatile memory, such as read only memory (ROM) or flash RAM. Computer-readable media devices include volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transitory medium that can be used to store information for access by a computing device.

Figure 2A:
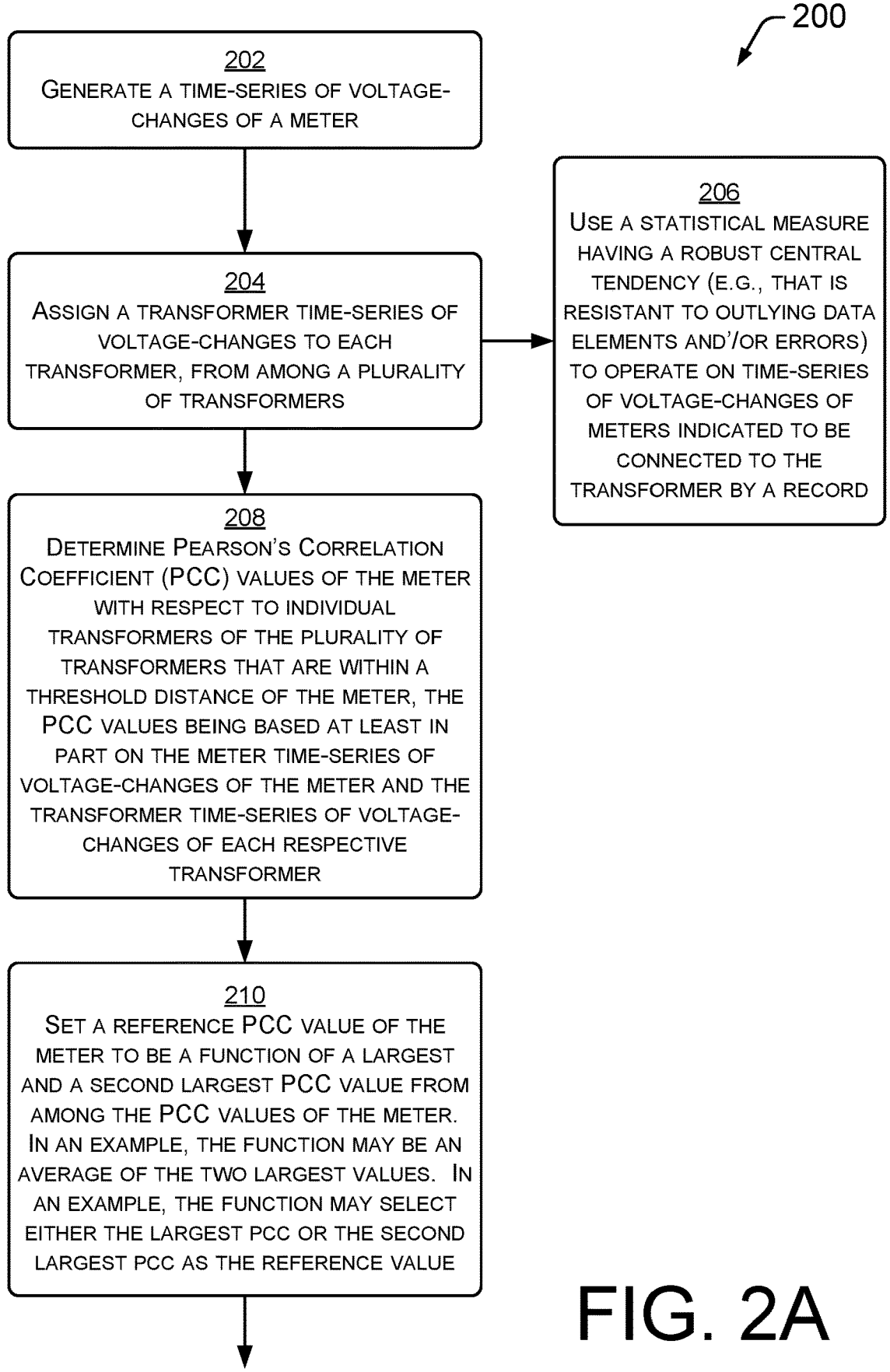
FIGS. 2A and 2B are flowcharts showing example operation of techniques for meter-to-transformer connectivity correction using voltage correlation, distance, and address data in a neural network.
Figure 2B:
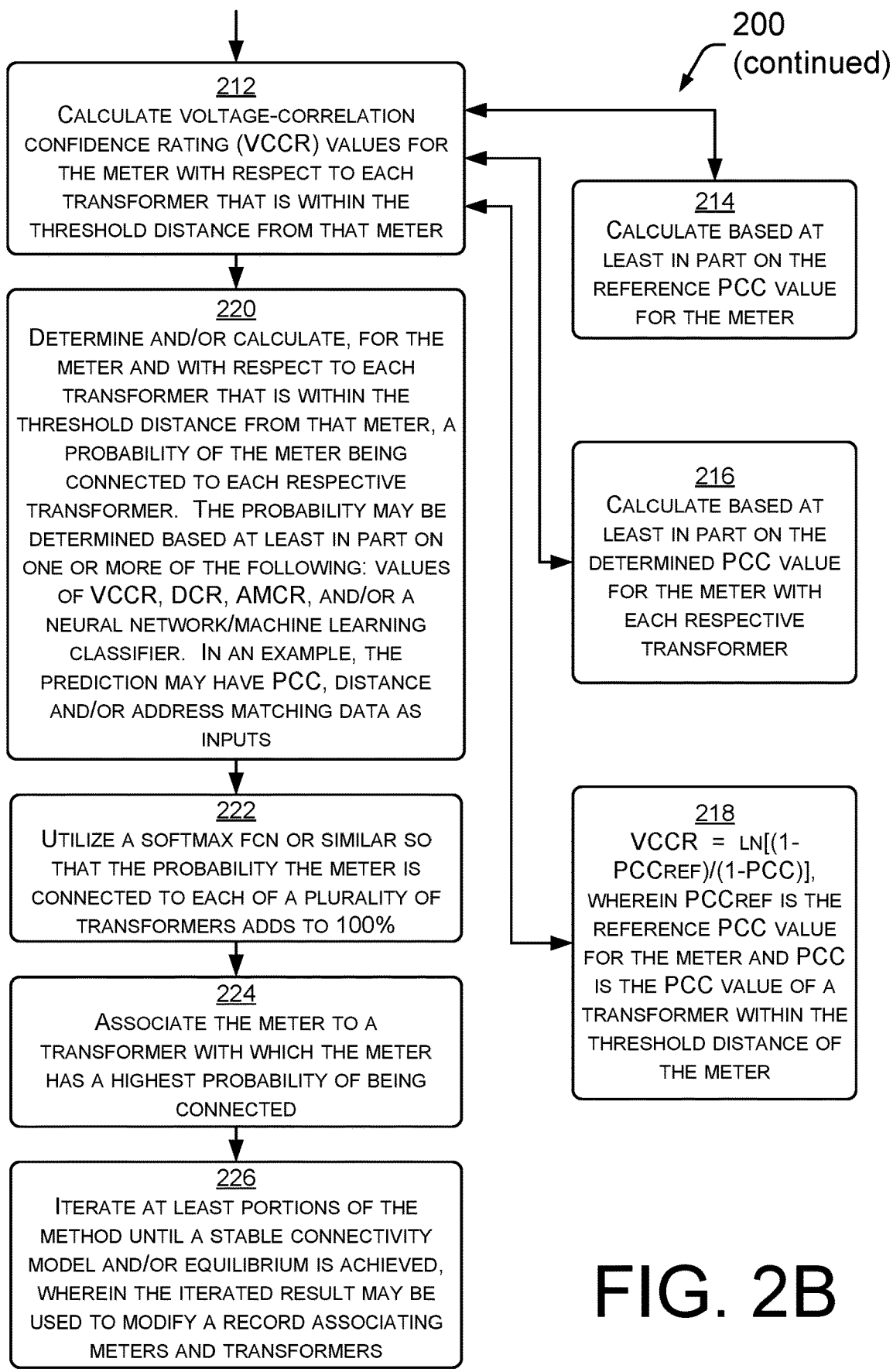

FIGS. 2A and 2B are flowcharts showing an example method 200 that provides meter-to-transformer connectivity information and/or correction using voltage correlation, distance, and address data in a neural network. In the example of FIG. 1, all or part of the software used to implement portions of the method 200 may be defined on one or both of memory devices 104 and 106. In some example implementations, all of part of the software may be configured as a neural network. In an example, voltage correlation data—in some examples supplemented with distance data and address-matching data—may be fed into a neural network. Distance and address-matching are discussed in more depth in one or more of FIGS. 3-8. The example neural network may have been trained to select the most likely of nearby transformers to associate with each electricity meter.

At block 202, a time-series of voltage-changes of a meter is generated, thereby forming a meter time-series of voltage-changes. In an example, a number of voltage measurements over time may indicate fluctuations in voltage. If an air conditioning unit turns on, it may cause a momentary drop in voltage, i.e., a voltage-change. Thus, the time-series of voltage-changes of the meter becomes a "signature" of that meter, characterized by voltage levels that respond to shifts in load and result in voltage-changes at particular times.

At block 204, a time-series of voltage-changes is assigned to each transformer, from among a plurality of transformers, resulting in a transformer time-series of voltage-changes. Most transformers do not have voltage-measuring hardware devices; accordingly, the assigned time-series may be estimated. The estimation may be based at least in part on the time-series of meters within a threshold distance of the transformer. Alternatively, the estimation may be based at least in part on the time-series of meters listed by existing records to be attached to the transformer. In the example of block 206, a statistical measure having a central tendency is used to operate on time-series of voltage-changes of meters indicated to be connected to the transformer by an existing record. Alternatively, block 206 may utilize a statistical measure having a central tendency to operate on time-series of voltage-changes of meters less than a threshold distance from the transformer. In either case, the meter time-series of voltage-changes that is most "central" or "median," from among the meters possibly connected (due to distance and/or records) to the transformer, is assigned to the transformer, as the transformer time-series of voltage-changes.

At block 208, Pearson's Correlation Coefficient (PCC) values of the meter with respect to individual transformers of the plurality of transformers that are within a threshold distance of the meter are determined. In an example, the PCC values are based at least in part on the meter time-series of voltage-changes of the meter and the transformer time-series of voltage-changes of each respective transformer. Accordingly, a PCC value is associated with the meter and each transformer within a threshold distance of the meter. Stated differently, PCC values are associated with the meter and each respective transformer within a threshold distance of the meter.

At block 210, a reference PCC value of the meter may be set to be an average of a largest and a second largest PCC value from among the PCC values of the meter.

At block 212, voltage-correlation confidence rating (VCCR) values are calculated for the meter with respect to each transformer that is within the threshold distance from that meter. Accordingly, a plurality of VCCR values are calculated, indicating a confidence rating of the meter being associated with each transformer to which the meter is close enough to be connected. The calculations may be based at least in part on blocks 214, 216. In the example of block 214, the calculation of the VCCR values may be made based at least in part on the reference PCC calculated at block 210. In the example of block 216, the VCCR values may be made based at least in part on the determined PCC value for the meter with each respective transformer, as calculated at block 208. In the example of FIG. 1, the meter 126 will have a first VCCR value regarding its association with transformer 114 and a second VCCR value regarding its association with transformer 116. The calculation of the VCCR values may be based at least in part on the example of block 218. At block 218, each VCCR value is calculated according to: VCCR=ln[(1−PCCref)/(1−PCC)], wherein PCCref is the reference PCC value for the meter and PCC is the PCC value of a transformer within the threshold distance of the meter.

At block 220, a probability that the meter is connected to each transformer that is within the threshold distance from that meter may be determined or calculated. The probability may be determined based at least in part on one or more of the following: values of a voltage-correlation confidence rating (VCCR) value, a distance confidence rating (DCR), an address matching confidence rating (AMCR), and/or a neural network/machine learning classifier. In an example, the prediction of probability may have PCC, distance and/or address matching data as inputs.

At block 222, a softmax function (or similar) is utilized so that the probability the meter is connected to each of a plurality of transformers is potentially changed somewhat, so that the total of the probabilities adds to 100%.

At block 224, the meter is associated with the transformer with which the meter has a highest probability of being connected. The association may result in an update of any records of the network topology, to thereby record and show that the meter is connected to the transformer.

At block 226, at least portions of the method may be iterated until a stable connectivity model is achieved and/or iterated until an equilibrium is reached. In an example, this may require between 5 and 10 iterations. However, the number of iterations may depend on a number of conditions, such as the starting position (the original data of meter to transformer connectivity) and number of errors in that position. In an example, the result of the method is used to modify a record, file and/or database associating meters and transformers.

FIGS. 3-7 show example methods that may be used to calculate input for the probability calculation of block 220. Accordingly, the methods of FIGS. 3-7 show examples of possible extensions and/or enhancements to block 212 of FIG. 2B, and examples of additional inputs to be provided to block 220 of FIG. 2B.

Figure 3:
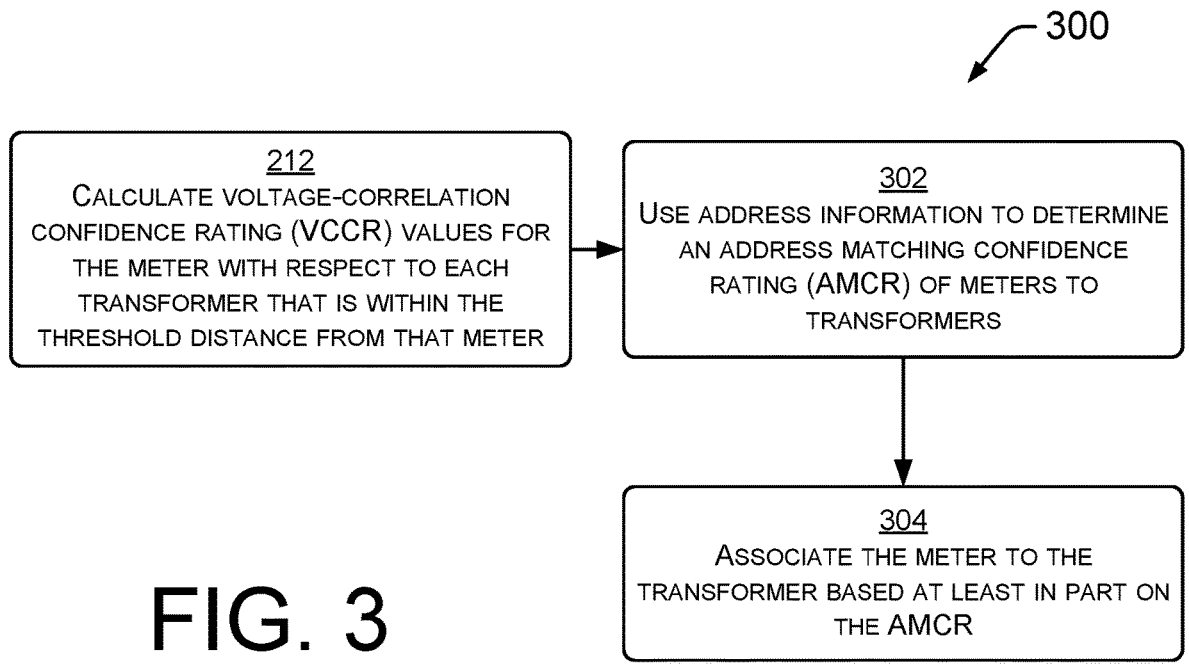
FIG. 3 is a flowchart showing example techniques for associating the meter to a transformer.

FIG. 3 shows an example method 300 to supplement the VCCR values with address information, and to thereby better associate the meter to a transformer. Accordingly, an address associated with a meter can be used, at least in part, to determine a transformer to which the meter is connected.

At block 302, address information is used to determine an address matching confidence rating (AMCR) of meters to transformers. At block 304, the meter is associated to the transformer based at least in part on the AMCR.

In a further example of AMCR, starting from an even (or odd) street address, a search may be performed for the next higher and/or the next lower street number, also having an even (or odd) address. This applies to areas where street addresses of the neighboring houses/buildings on the same side of the street have even (or odd) addresses. Once we have the street addresses of the neighboring lots, a search is made for any meters at those addresses and for any meters at the same address as the original meter in question, and look up their current transformer connections. In an example, an algorithm decides between transformers A, B, C, and D for association with meter M. If the above technique is used and finds that the meter on the building to the left of meter M is connected to transformer A, and the meter on the building to the right of meter M is connected to transformer B. In this case, it is likely that meter M is connected to either transformer A or B. This search of available data supplements distance and voltage correlation data to achieve benefits in correlating the meter to an appropriate transformer.

Figure 4:
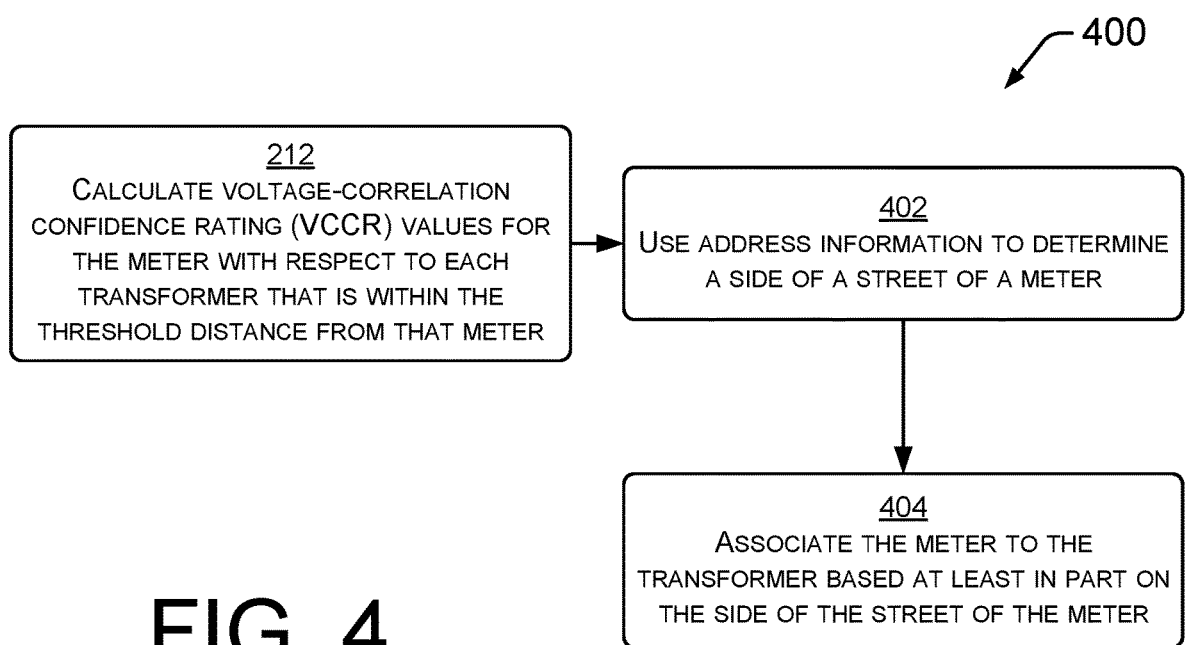
FIG. 4 is a flowchart showing example techniques for associating the meter to a transformer.

FIG. 4 shows an example method 400 to supplement the VCCR values with address information, and to thereby better associate the meter to a transformer. In a more particular example, in many cases the address associated with a meter can be used to determine a city block within which a meter is located. At block 402, address information may be used to determine a side of a street of a meter. In the example, even numbered addresses may be on one side of the street and odd numbered addresses on the other side. At block 404, accordingly, the meter may be associated with a transformer based at least in part on even vs. odd street number and/or the side of the street on which the meter is located.

Figure 5:
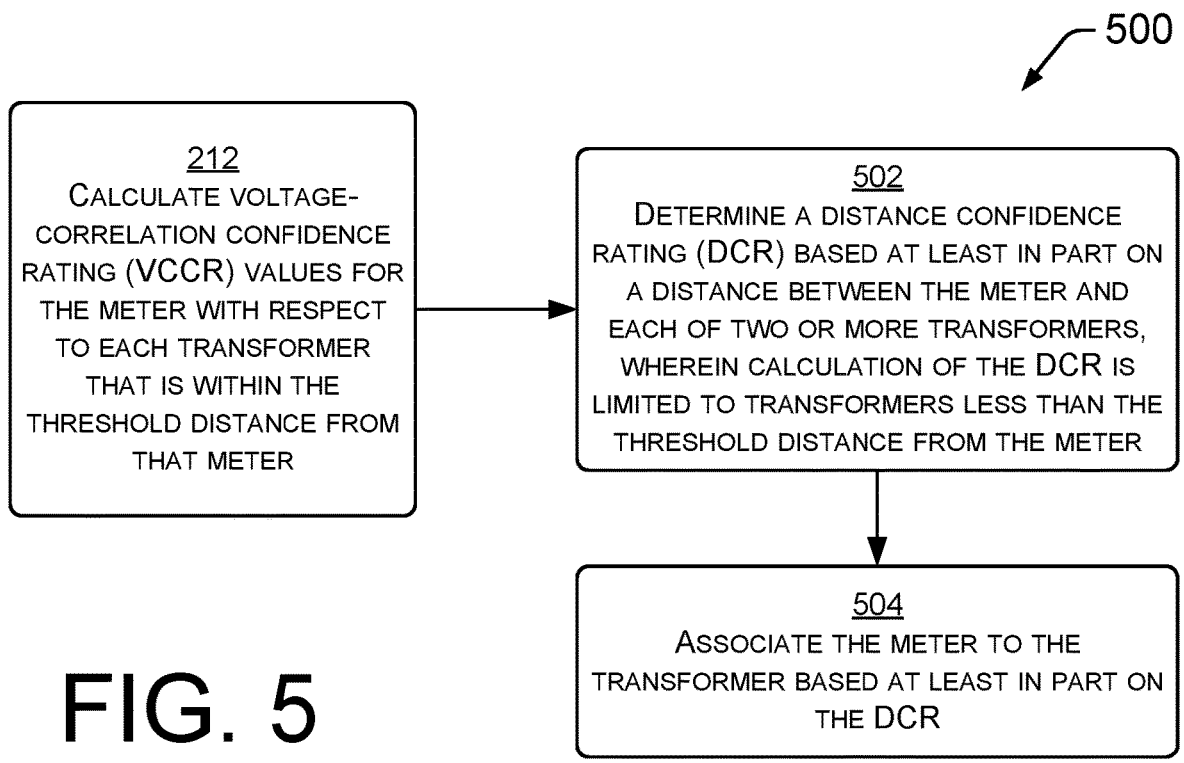
FIG. 5 is a flowchart showing example techniques for associating the meter to a transformer.

FIG. 5 shows an example method 500 to supplement the VCCR values with distance information, and to thereby better associate the meter to a transformer. In the example, a distance confidence rating increases the accuracy of selecting the correct transformer for the meter. In a further example, and similarly to the calculation of VCCR, the DCR could be calculated for each of the nearest x transformers from a reference distance (Dref) of the meter, and from the distance (D) from the meter to each specific transformer. Given: distance (D1) from meter (M) to closest transformer (T1)=5 ft; distance (D2) from meter (M) to second closest transformer (T2)=7 ft; and distance (D3) from meter (M) to third closest transformer (T3)=12 ft. Then: Dref=(D1+D2)/2=6 ft. For T1, DCR=ln[Dref/D1]=ln[6 ft/5 ft]=0.079. For T2, DCR=ln[Dref/D2]=ln[6 ft/7 ft]=−0.067. For T3, DCR=ln[Dref/D3]=ln[6 ft/12 ft]=−0.301.

At block 502, a distance confidence rating (DCR) based at least in part on a distance between the meter and each of two or more transformers, is determined. In the example, calculation of the DCR is limited to transformers less than the threshold distance from the meter. At block 504, the meter is associated with the transformer based at least in part on the DCR.

Figure 6:
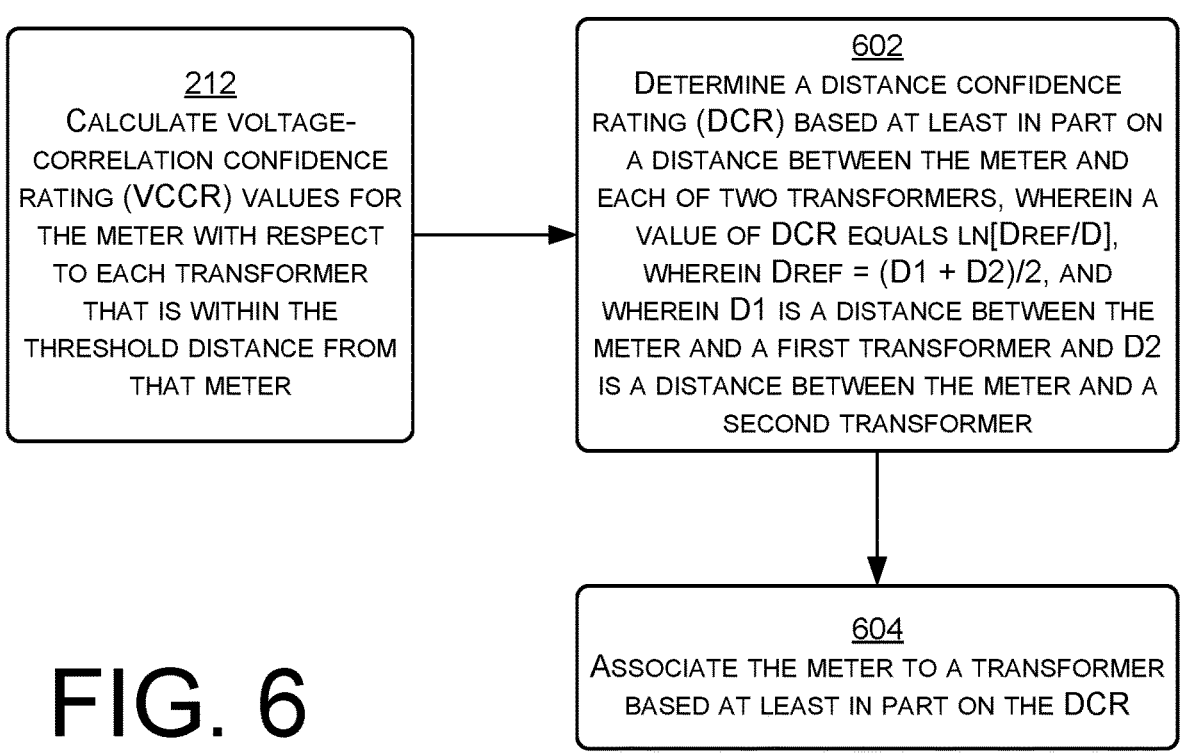
FIG. 6 is a flowchart showing example techniques for associating the meter to a transformer.

FIG. 6 shows an example method 600 to supplement the VCCR values with distance information, and to thereby better associate the meter to a transformer. At block 602, a distance confidence rating (DCR) is determined. In an example, the DCR is based at least in part on a distance between the meter and each of two transformers, wherein a value of DCR equals ln[Dref/D], wherein Dref=(D1+D2)/2, and wherein D1 is a distance between the meter and a first transformer and D2 is a distance between the meter and a second transformer. At block 604, the meter is associated with a transformer based at least in part on the DCR.

Figure 7:
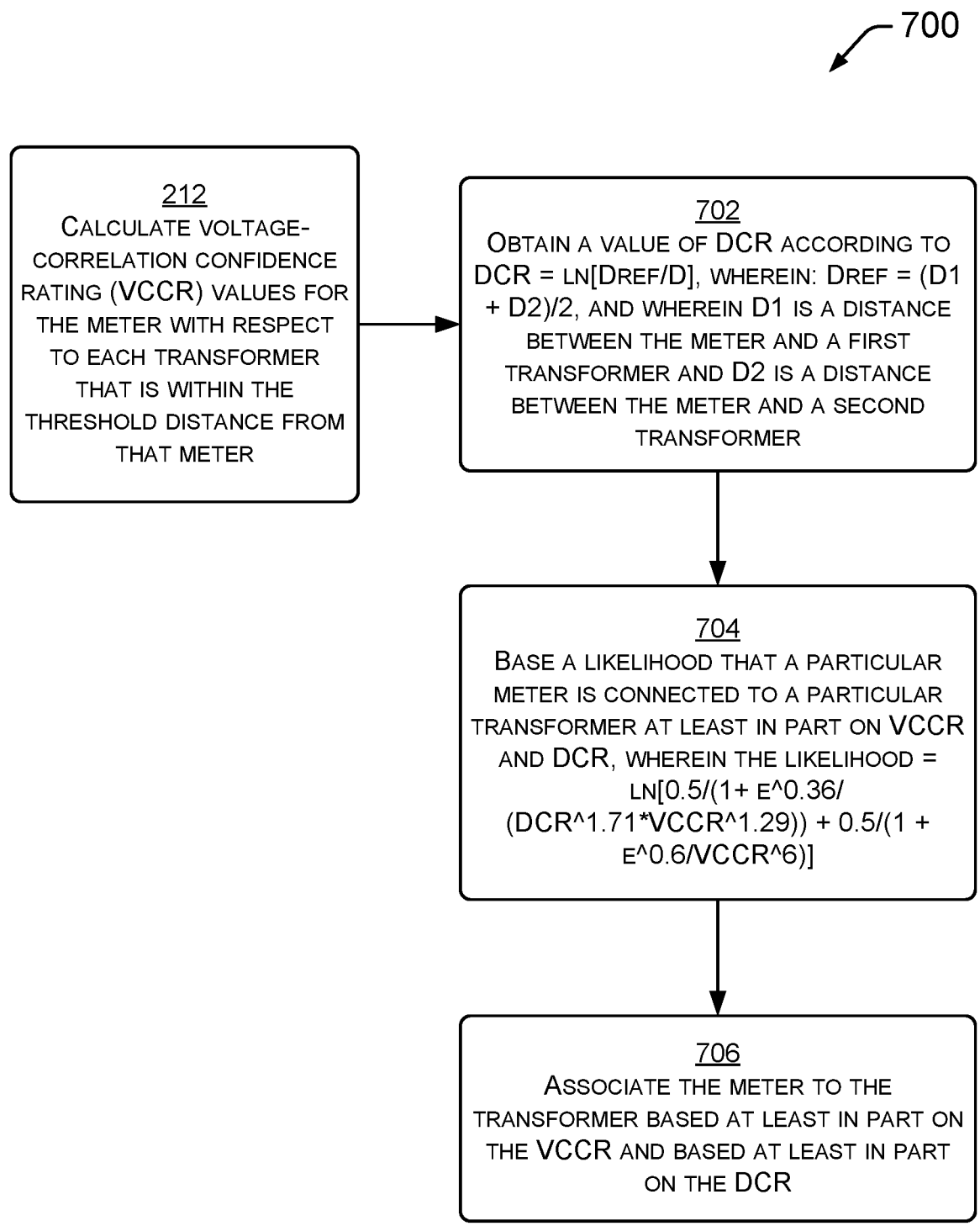
FIG. 7 is a flowchart showing example techniques for associating the meter to a transformer.

FIG. 7 shows an example method 700 to supplement the VCCR values with distance information, and to thereby better associate the meter to a transformer. The method provides a means to calculate the distance confidence rating (DCR), and a means to calculate a likelihood that each transformer is associated with (e.g., connected to) the meter.

At block 702, a value of DCR is obtained according to $DCR=\ln[D_{ref}/D]$, wherein: $D_{ref}=(D1+D2)/2$, and wherein D1 is a distance between the meter and a first transformer and D2 is a distance between the meter and a second transformer. At block 704, a likelihood that the meter is connected to a particular transformer is based at least in part on VCCR and DCR, wherein:

the likelihood=$\ln[0.5/(1+e^{0.36/(DCR^{1.71}*VCCR^{1.29})})+0.5/(1+e^{0.6/VCCR^{6}})]$.

At block 706, the meter is associated with the transformer based at least in part on the VCCR and based at least in part on the DCR.

Example Systems and Devices

Since transformers typically do not have voltage-metering hardware, in example implementations transformer voltage and/or transformer time-series of voltage-changes may be estimated using median downstream meter voltages. In an example, the transformer voltage and/or transformer time-series of voltage-changes may be obtained by a correlation done with each meter to the nearest 15 transformers. Voltage correlation data, in some examples supplemented with distance and address-matching data, can be fed into a neural network. In an example, a neural network may be used that has been trained to select the most likely of the nearest 15—or other number of—transformers as being the transformer to which an electricity meter is attached. Problematic transformers may be identified for manual attention to facilitate data cleaning (i.e., fixing data that describes aspects of the topology of a network).

In one example of meter-to-transformer connectivity correction, a time-series of voltage-changes is measured and/or calculated for each of a plurality of meters. For one or more transformers, a time-series of voltage-changes is assigned. The assignment may be based on the time-series of one or more meters (e.g., a median meter having the median voltage-change more often than other meters) from among meters existing records say are attached to a transformer, to be the time-series of the transformer. The Pearson's Correlation Coefficient (PCC) between a meter and each transformers within a threshold distance of the meter is determined, using the time-series of the meter correlated to the estimated (and/or assigned) voltage-change time-series for the transformer. For each meter, a reference PCC is set for that meter to be an average of the two highest PCC values of the meter. Voltage-correlation confidence rating (VCCR) values are calculated for each meter with each transformer within the threshold distance of the meter, using the set PCC value for the meter and the PCC value of each transformer. For each meter, all transformer VCCR values (associated with transformers less than the threshold distance) are sent to an algorithm (e.g., softmax). Each meter from among the plurality of meters is associated with an "overall confidence value" of being connected to each transformer within the threshold distance of the meter, wherein the associating may be based at least in part on the VCCR values, and wherein for each meter a sum of the confidence values for all possible meter-to-transformers connections is 100%. Each meter is assigned to the transformer with which the meter has the greatest "overall confidence value."

The following examples of meter-to-transformer connectivity correction are expressed as number clauses. While the examples illustrate a number of possible configurations and techniques, they are not meant to be an exhaustive listing of the systems, methods, and/or computer- or processor-readable media described herein.

1. A method, comprising: generating a meter time-series of voltage-changes of a meter; assigning a transformer time-series of voltage-changes to each transformer, from among a plurality of transformers; determining Pearson's Correlation Coefficient (PCC) values of the meter with respect to individual transformers of the plurality of transformers that are within a threshold distance of the meter, the PCC values being based at least in part on the meter time-series of voltage-changes of the meter and the transformer time-series of voltage-changes of each respective transformer. In an example, the time-series may be estimated from time-series of voltage changes from all the currently associated meters; setting a reference PCC value of the meter to be an average of a largest and a second largest PCC value from among the PCC values of the meter; calculating voltage-correlation confidence rating (VCCR) values for the meter with respect to each transformer that is within the threshold distance from that meter, wherein the calculating is based at least in part on: the reference PCC value for the meter; and the determined PCC value for the meter with each respective transformer; determining, based at least in part on the VCCR values for the meter with respect to each transformer that is within the threshold distance from that meter, a probability of the meter being connected to each transformer within the threshold distance of the meter; and associating the meter to a transformer with which the meter has a highest probability of being connected.

2. The method of clause 1, wherein assigning the transformer time-series of voltage-changes to the transformer comprises: using a statistical measure having central tendency operating on time-series of voltage-changes of meters indicated to be connected to the transformer by a record.

3. The method of clause 1 or any preceding clause, additionally comprising: iterating at least portions of the method until a stable connectivity model is achieved; and modifying a record associating meters and transformers using the stable connectivity model.

4. The method of clause 1 or any preceding clause, wherein calculating the VCCR values for the meter comprises: $VCCR=\ln[(1-PCCref)/(1-PCC)]$, wherein PCCref is the reference PCC value for the meter and PCC is the PCC value of a transformer within the threshold distance of the meter.

5. The method of clause 1 or any preceding clause, wherein associating the meter to the transformer additionally comprises: using address information to determine an address matching confidence rating (AMCR) of meters to transformers; wherein associating the meter to the transformer is based at least in part on the AMCR.

6. The method of clause 1 or any preceding clause, wherein associating the meter to the transformer additionally comprises: using address information to determine a side of a street of a meter; wherein associating the meter to the transformer is based at least in part on the side of the street of the meter.

7. The method of clause 1 or any preceding clause, wherein associating the meter to the transformer additionally comprises: determining a distance confidence rating (DCR) based at least in part on a distance between the meter and each of two or more transformers, wherein calculation of the DCR is limited to transformers less than the threshold distance from the meter; and associating the meter to the transformer based at least in part on the DCR.

8. The method of clause 1 or any preceding clause, wherein associating the meter to the transformer additionally comprises: determining a distance confidence rating (DCR) based at least in part on a distance between the meter and each of two transformers, wherein a value of DCR equals ln[Dref/D], wherein Dref=(D1+D2)/2, and wherein D1 is a distance between the meter and a first transformer and D2 is a distance between the meter and a second transformer; and associating the meter to a transformer based at least in part on the DCR.

9. The method of clause 1 or any preceding clause, wherein associating the meter to the transformer additionally comprises: obtaining a value of DCR according to DCR=ln [Dref/D], wherein: Dref=(D1+D2)/2, and wherein D1 is a distance between the meter and a first transformer and D2 is a distance between the meter and a second transformer; and basing a likelihood that the meter is connected to a particular transformer at least in part on VCCR and DCR, wherein the likelihood=ln[0.5/(1+e^0.36/(DCR^1.71*VCCR^1.29))+0.5/(1+e^0.6/VCCR^6)]; wherein associating the meter to the transformer based at least in part on the VCCR and based at least in part on the DCR.

10. The method of clause 1 or any preceding clause, wherein associating the meter to the transformer is based at least in part on operation of a softmax function.

11. A system, comprising: a plurality of meters; a plurality of transformers; a computing device, configured to determine connectivity between meters and transformers, by performing a method comprising: generating a time-series of voltage-changes for each of the plurality of meters; assigning a time-series of voltage-changes to each transformer, wherein the assignments are based at least in part on a statistical measure having central tendency applied to the generated time-series of voltage-changes of one or more meters indicated to be connected to the transformer based on an existing record; determining a Pearson's Correlation Coefficient (PCC) value between a meter and each transformer within a threshold distance of the meter, based at least in part on the time-series of voltage-changes generated for each meter and based at least in part on the assigned time-series of voltage-changes of each transformer; setting, for each meter of the plurality of meters, a reference PCC value to be an average of a largest and a second largest PCC value of that meter; calculating voltage-correlation confidence rating (VCCR) values for each meter with each transformer that is less than the threshold distance from that meter, wherein the calculating is based at least in part on the determined PCC value and the reference PCC value; and associating each of the plurality of meters to a transformer based at least in part on the VCCR value of each meter with each transformer that is less than the threshold distance from that meter.

12. The system as recited in clause 11, wherein the method additionally comprises: passing the VCCR values for each meter to a softmax function to set a sum of overall confidence values of a connection of the meter to each transformer within the threshold distance of the meter to 100%.

13. The system as recited in clause 11 or any preceding clause, wherein the method additionally comprises: determining a distance confidence rating (DCR) based at least in part on a distance between each meter and transformers less than the threshold distance from that meter; and associating that meter with a transformer based at least in part on a DCR value of that meter.

14. The system as recited in clause 11 or any preceding clause, wherein the method additionally comprises: using address information to determine an address matching confidence rating (AMCR) between each meter and transformers less than the threshold distance from that meter; and associating that meter with a transformer based at least in part on an AMCR value of that meter.

15. The system as recited in clause 11 or any preceding clause, wherein the method additionally comprises: iterating at least portions of the method until a stable connectivity model is achieved; and changing at least one transformer-to-meter connection based at least in part on the stable connectivity model.

16. One or more computer-readable media storing computer-executable instructions that, when executed by one or more processors, configure a computing device to perform acts comprising: generating a time-series of voltage-changes for a meter; assigning a time-series of voltage-changes to each transformer from among transformers less than a threshold distance from the meter, wherein the assignments are based at least in part on a statistical measure having a central tendency applied to time-series of voltage-changes of one or more meters indicated based on an existing record to be connected to the transformer; determining a Pearson's Correlation Coefficient (PCC) value between the meter and each transformer within the threshold distance of the meter, using as input a time-series of voltage-changes of the meter and using the assigned time-series of voltage-changes of each transformer; setting, for the meter, a reference PCC value to be an average of a largest and a second largest PCC value of the meter; calculating voltage-correlation confidence rating (VCCR) values for the meter with each transformer that is less than the threshold distance from that meter, wherein the calculating is based at least in part on the determined PCC value and the reference PCC value; and associating the meter to a transformer based at least in part on the VCCR value of the meter with each transformer that is less than the threshold distance from the meter.

17. The one or more computer-readable media as recited in clause 16, wherein the acts additionally comprise: iterating at least portions of the method until a stable connectivity model is achieved; and modifying a record associating meters and transformers using the stable connectivity model.

18. The one or more computer-readable media as recited in clause 16 or any preceding clause, wherein the acts additionally comprise: associating a meter with overall confidence values of being connected to each transformer within the threshold distance of the meter, wherein the associating is based at least in part on the VCCR values, and wherein a sum of the overall confidence values of connections between the meter and each transformer within the threshold distance of the meter is set to 100% by a softmax function; and updating the existing record to associate the meter to a transformer with which the meter has a greatest overall confidence value.

19. The one or more computer-readable media as recited in clause 16 or any preceding clause, wherein the acts additionally comprise: determining a distance confidence rating (DCR) based at least in part on a distance between the meter and each of two or more transformers, wherein calculation of DCR is limited to transformers less than the threshold distance from the meter; and associating the meter with a transformer based at least in part on the DCR.

20. The one or more computer-readable media as recited in clause 16 or any preceding clause, wherein the acts additionally comprise: using address information to determine an address matching confidence rating (AMCR) of meters to transformers; and associating meters to transformers based at least in part on the AMCR.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method, comprising:
generating a meter time-series of voltage-changes of a meter;
assigning a transformer time-series of voltage-changes to each transformer, from among a plurality of transformers;
determining Pearson's Correlation Coefficient (PCC) values of the meter with respect to individual transformers of the plurality of transformers that are within a threshold distance of the meter, the PCC values being based at least in part on the meter time-series of voltage-changes of the meter and the transformer time-series of voltage-changes of each respective transformer;
setting a reference PCC value of the meter to be an average of the largest and the second largest PCC value from among the PCC values of the meter;
calculating voltage-correlation confidence rating (VCCR) values for the meter with respect to each transformer that is within the threshold distance from that meter, wherein the calculating is based at least in part on:
the reference PCC value for the meter; and
the determined PCC value for the meter with each respective transformer;
determining, based at least in part on the VCCR values for the meter with respect to each transformer that is within the threshold distance from that meter, a probability of the meter being connected to each transformer within the threshold distance of the meter; and
associating the meter to a transformer with which the meter has the highest probability of being connected, wherein the associating forms at least part of an updated record, and
wherein the updated record is configured to indicate corrections of over-loaded transformers.

2. The method of claim 1, wherein assigning the transformer time-series of voltage-changes to the transformer comprises:
using a statistical measure having central tendency operating on time-series of voltage-changes of meters indicated to be connected to the transformer by a record.

3. The method of claim 1, additionally comprising:
iterating at least portions of the method until a stable connectivity model is achieved; and
modifying a record associating meters and transformers using the stable connectivity model.

4. The method of claim 1, wherein calculating the VCCR values for the meter comprises:
$VCCR=\ln[(1-PCC_{ref})/(1-PCC)]$, wherein $PCC_{ref}$ is the reference PCC value for the meter and PCC is the PCC value of a transformer within the threshold distance of the meter.

5. The method of claim 1, wherein associating the meter to the transformer additionally comprises:
using address information to determine an address matching confidence rating (AMCR) of meters to transformers;
wherein associating the meter to the transformer is based at least in part on the AMCR.

6. The method of claim 1, wherein associating the meter to the transformer additionally comprises:
using address information to determine a side of a street of a meter;
wherein associating the meter to the transformer is based at least in part on the side of the street of the meter.

7. The method of claim 1, wherein associating the meter to the transformer additionally comprises:
determining a distance confidence rating (DCR) based at least in part on a distance between the meter and each of two or more transformers, wherein calculation of the DCR is limited to transformers less than the threshold distance from the meter; and
associating the meter to the transformer based at least in part on the DCR.

8. The method of claim 1, wherein associating the meter to the transformer additionally comprises:
determining a distance confidence rating (DCR) based at least in part on a distance between the meter and each of two transformers, wherein a value of DCR equals $\ln[Dref/D]$, wherein $Dref=(D1+D2)/2$, and wherein D1 is a distance between the meter and a first transformer and D2 is a distance between the meter and a second transformer; and
associating the meter to a transformer based at least in part on the DCR.

9. The method of claim 1, wherein associating the meter to the transformer additionally comprises:
obtaining a value of DCR according to $DCR=\ln[Dref/D]$, wherein: $Dref=(D1+D2)/2$, and wherein D1 is a distance between the meter and a first transformer and D2 is a distance between the meter and a second transformer; and
basing a likelihood that the meter is connected to a particular transformer at least in part on VCCR and DCR, wherein the $likelihood=\ln[0.5/(1+e^{0.36/(DCR^{1.71}*VCCR^{1.29})})+0.5/(1+e^{0.6/VCCR^{6}})]$;
wherein associating the meter to the transformer is based at least in part on the VCCR and based at least in part on the DCR.

10. The method of claim 1, wherein associating the meter to the transformer is based at least in part on operation of a softmax function.

11. A system, comprising:
a plurality of meters;
a plurality of transformers;
a computing device, configured to determine connectivity between meters and transformers, by performing a method comprising:
generating a time-series of voltage-changes for each of the plurality of meters;
assigning a time-series of voltage-changes to each transformer, wherein the assignments are based at least in part on a statistical measure having central tendency applied to the generated time-series of voltage-changes of one or more meters indicated to be connected to the transformer based on an existing record;
determining a Pearson's Correlation Coefficient (PCC) value between a meter and each transformer within a threshold distance of the meter, based at least in part on the time-series of voltage-changes generated for each meter and based at least in part on the assigned time-series of voltage-changes of each transformer;

setting, for each meter of the plurality of meters, a reference PCC value to be an average of the largest and the second largest PCC value of that meter;

calculating voltage-correlation confidence rating (VCCR) values for each meter with each transformer that is less than the threshold distance from that meter, wherein the calculating is based at least in part on the determined PCC value and the reference PCC value; and associating each of the plurality of meters to a transformer based at least in part on the VCCR value of each meter with each transformer that is less than the threshold distance from that meter, wherein the associating forms at least part of an updated record, and wherein the updated record is configured to indicate corrections of over-loaded transformers.

12. The system as recited in claim 11, wherein the method additionally comprises:

passing the VCCR values for each meter to a softmax function to set a sum of overall confidence values of a connection of the meter to each transformer within the threshold distance of the meter to 100%.

13. The system as recited in claim 11, wherein the method additionally comprises:

determining a distance confidence rating (DCR) based at least in part on a distance between each meter and transformers less than the threshold distance from that meter; and associating that meter with a transformer based at least in part on a DCR value of that meter.

14. The system as recited in claim 11, wherein the method additionally comprises:

using address information to determine an address matching confidence rating (AMCR) between each meter and transformers less than the threshold distance from that meter; and associating that meter with a transformer based at least in part on an AMCR value of that meter.

15. The system as recited in claim 11, wherein the method additionally comprises:

iterating at least portions of the method until a stable connectivity model is achieved; and changing at least one transformer-to-meter connection based at least in part on the stable connectivity model.

16. One or more non-transitory computer-readable media storing computer-executable instructions that, when executed by one or more processors, configure a computing device to perform acts comprising:

generating a time-series of voltage-changes for a meter;

assigning a time-series of voltage-changes to each transformer from among transformers less than a threshold distance from the meter, wherein the assignments are based at least in part on a statistical measure having a central tendency applied to time-series of voltage-changes of one or more meters indicated based on an existing record to be connected to the transformer;

determining a Pearson's Correlation Coefficient (PCC) value between the meter and each transformer within the threshold distance of the meter, using as input a time-series of voltage-changes of the meter and using the assigned time-series of voltage-changes of each transformer;

setting, for the meter, a reference PCC value to be an average of the largest and the second largest PCC value of the meter;

calculating voltage-correlation confidence rating (VCCR) values for the meter with each transformer that is less than the threshold distance from that meter, wherein the calculating is based at least in part on the determined PCC value and the reference PCC value; and associating the meter to a transformer based at least in part on the VCCR value of the meter with each transformer that is less than the threshold distance from the meter, wherein the associating forms at least part of an updated record, and wherein the updated record is configured to indicate corrections of over-loaded transformers.

17. The one or more non-transitory computer-readable media as recited in claim 16, wherein the acts additionally comprise:

iterating at least portions of the method until a stable connectivity model is achieved; and modifying a record associating meters and transformers using the stable connectivity model.

18. The one or more non-transitory computer-readable media as recited in claim 16, wherein the acts additionally comprise:

associating a meter with overall confidence values of being connected to each transformer within the threshold distance of the meter, wherein the associating is based at least in part on the VCCR values, and wherein a sum of the overall confidence values of connections between the meter and each transformer within the threshold distance of the meter is set to 100% by a softmax function; and updating the existing record to associate the meter to a transformer with which the meter has the greatest overall confidence value.

19. The one or more non-transitory computer-readable media as recited in claim 16, wherein the acts additionally comprise:

determining a distance confidence rating (DCR) based at least in part on a distance between the meter and each of two or more transformers, wherein calculation of DCR is limited to transformers less than the threshold distance from the meter; and associating the meter with a transformer based at least in part on the DCR.

20. The one or more non-transitory computer-readable media as recited in claim 16, wherein the acts additionally comprise:

using address information to determine an address matching confidence rating (AMCR) of meters to transformers; and associating meters to transformers based at least in part on the AMCR.

* * * * *